(12) United States Patent
Ichikawa

(10) Patent No.: US 11,652,032 B2
(45) Date of Patent: May 16, 2023

(54) SEMICONDUCTOR DEVICE HAVING INNER LEAD EXPOSED FROM SEALING RESIN, SEMICONDUCTOR DEVICE MANUFACTURING METHOD THEREOF, AND POWER CONVERTER INCLUDING THE SEMICONDUCTOR DEVICE

(71) Applicant: Mitsubishi Electric Corporation, Tokyo (JP)

(72) Inventor: Keitaro Ichikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/329,992

(22) Filed: May 25, 2021

(65) Prior Publication Data

US 2022/0108941 A1 Apr. 7, 2022

(30) Foreign Application Priority Data

Oct. 1, 2020 (JP) .............................. JP2020-166641

(51) Int. Cl.
| | |
|---|---|
| *H01L 23/495* | (2006.01) |
| *H01L 21/48* | (2006.01) |
| *H01L 21/56* | (2006.01) |
| *H01L 23/31* | (2006.01) |
| *H01L 23/373* | (2006.01) |
| *H01L 23/00* | (2006.01) |
| *H02P 27/08* | (2006.01) |

(52) U.S. Cl.
CPC .... *H01L 23/49555* (2013.01); *H01L 21/4842* (2013.01); *H01L 21/56* (2013.01); *H01L 23/3114* (2013.01); *H01L 23/3735* (2013.01); *H01L 23/49503* (2013.01); *H01L 23/49562* (2013.01); *H01L 24/45* (2013.01); *H01L 24/46* (2013.01); *H01L 24/49* (2013.01); *H01L 2924/13055* (2013.01); *H02P 27/08* (2013.01)

(58) Field of Classification Search
CPC ... H01L 2924/181; H01L 24/45; H01L 24/46; H01L 24/49; H01L 23/49555; H01L 23/3735; H01L 23/49503; H01L 23/49562; H01L 23/3114; H01L 21/56; H01L 21/4842; H01L 2924/13055
See application file for complete search history.

(56) References Cited

U.S. PATENT DOCUMENTS

| | | | | |
|---|---|---|---|---|
| 7,598,600 B2 * | 10/2009 | Tang | ................. | H01L 23/49562 257/E23.047 |
| 8,575,742 B1 * | 11/2013 | Kim | ................. | H01L 23/49541 257/730 |
| 9,355,945 B1 * | 5/2016 | Ge | ..................... | H01L 23/3107 |

(Continued)

FOREIGN PATENT DOCUMENTS

| | | |
|---|---|---|
| JP | S62-229865 A | 10/1987 |
| JP | H10-223825 A | 8/1998 |

*Primary Examiner* — Alonzo Chambliss
(74) *Attorney, Agent, or Firm* — Studebaker & Brackett PC

(57) ABSTRACT

Inner leads having die pads having upper surfaces to which semiconductor elements are mounted each have a stepped profile, and surfaces of portions of the inner leads are exposed from a sealing resin in plan view. Outer leads connected to the inner leads have first bends at side surfaces of the sealing resin to extend in a direction on a side of the upper surfaces of the die pads, so that a miniaturized semiconductor device can be obtained.

18 Claims, 12 Drawing Sheets

(56) References Cited

U.S. PATENT DOCUMENTS

| | | | | |
|---|---|---|---|---|
| 2010/0001384 A1* | 1/2010 | Bathan | H01L 23/49503 | 257/676 |
| 2010/0163918 A1* | 7/2010 | Kim | H01L 25/0753 | 257/E33.059 |
| 2010/0258922 A1* | 10/2010 | Nakamura | H01L 24/32 | 257/676 |
| 2014/0210093 A1* | 7/2014 | Wang | H01L 21/56 | 257/773 |
| 2014/0374776 A1* | 12/2014 | Nakasuji | H01L 25/167 | 257/82 |
| 2015/0115289 A1* | 4/2015 | Fursin | H01L 29/7395 | 257/77 |
| 2015/0325505 A1* | 11/2015 | Wang | H01L 23/31 | 438/123 |
| 2016/0064353 A1* | 3/2016 | Zhang | H01L 24/43 | 438/123 |
| 2017/0294369 A1* | 10/2017 | Kawashima | H01L 24/32 | |
| 2019/0355718 A1* | 11/2019 | Nakano | H01L 29/41741 | |
| 2021/0118815 A1* | 4/2021 | Kosugi | H01L 24/48 | |
| 2021/0327777 A1* | 10/2021 | Iwai | H01L 23/31 | |

* cited by examiner

SEMICONDUCTOR DEVICE HAVING INNER LEAD EXPOSED FROM SEALING RESIN, SEMICONDUCTOR DEVICE MANUFACTURING METHOD THEREOF, AND POWER CONVERTER INCLUDING THE SEMICONDUCTOR DEVICE

BACKGROUND OF THE INVENTION

Field of the Invention

The present disclosure relates to a semiconductor device having power semiconductor elements mounted thereto, a semiconductor device manufacturing method, and a power converter.

Description of the Background Art

In a conventional semiconductor device, a lead protrudes from a side surface of a sealed resin portion, and is bent by bending at a substantially right angle at a bent portion near the resin portion (see Japanese Patent Application Laid-Open No. S62-229865 (the 5th line in the lower right column on page 2 to the 6th line in the upper left column on page 3, and FIGS. 1 to 5), for example).

Miniaturization of semiconductor devices has been required in recent years as a semiconductor device is implemented on a control substrate together with a variety of electronic components. The semiconductor device is miniaturized by causing a raised portion of a lead terminal to protrude downward from a lower surface of a sealing resin (see Japanese Patent Application Laid-Open No. H10-223825 (paragraphs 0030, 0032 to 0033, 0036, and FIGS. 9 and 11), for example).

In such a semiconductor device, however, it is required to newly prepare a mold having a slit allowing for insertion of a lead in a sealing step of performing transfer molding, although the semiconductor device can be miniaturized by causing the lead to protrude vertically from a sealing resin of the semiconductor device. Furthermore, it is required to prepare a mold for each of semiconductor devices as the location where the lead is disposed varies with a specification of the semiconductor device.

SUMMARY

The present disclosure has been conceived to solve a problem as described above, and it is an object of the present disclosure to provide a semiconductor device and a semiconductor device manufacturing method allowing for miniaturization due to the shape of a lead.

A semiconductor device according to the present disclosure includes a semiconductor element, an inner lead, a sealing resin, and an outer lead. The inner lead has a die pad having an upper surface to which the semiconductor element is mounted. The sealing resin seals the semiconductor element and the inner lead. The outer lead is electrically connected to the semiconductor element and the inner lead, and protrudes from opposing side surfaces of the sealing resin. The inner lead has a stepped profile. A surface of a portion of the inner lead is exposed from the sealing resin in plan view. The outer lead has a first bend at each of the side surfaces of the sealing resin to extend in a direction on a side of the upper surface of the die pad.

A semiconductor device manufacturing method according to the present disclosure includes a member preparation step of preparing a lead frame including an inner lead having a die pad, a tie bar, a framework, and an outer lead, and having a stepped profile; a die bonding step of mounting a semiconductor element to the die pad; a wiring step of wiring the semiconductor element and the inner lead using a metal wire; a sealing step of sealing the semiconductor element, the metal wire, and the inner lead with a sealing resin so that the inner lead has an exposed surface that is a surface of a portion of the inner lead and exposed in plan view; a tie bar cutting step of cutting and removing the tie bar; a plating step of plating the outer lead, the exposed surface of the inner lead exposed from the sealing resin, and the framework; a frame cutting step of cutting and removing the framework; and a lead forming step of bending the outer lead at opposing side surfaces of the sealing resin.

According to the present disclosure, an easily miniaturized semiconductor device can be obtained, and the layout area of the semiconductor device implemented on a control substrate is reduced by the bent shape of the outer lead.

According to the semiconductor device manufacturing method according to the present disclosure, the easily miniaturized semiconductor device can be obtained, and the layout area of the semiconductor device implemented on the control substrate is reduced by the bent shape of the outer lead.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
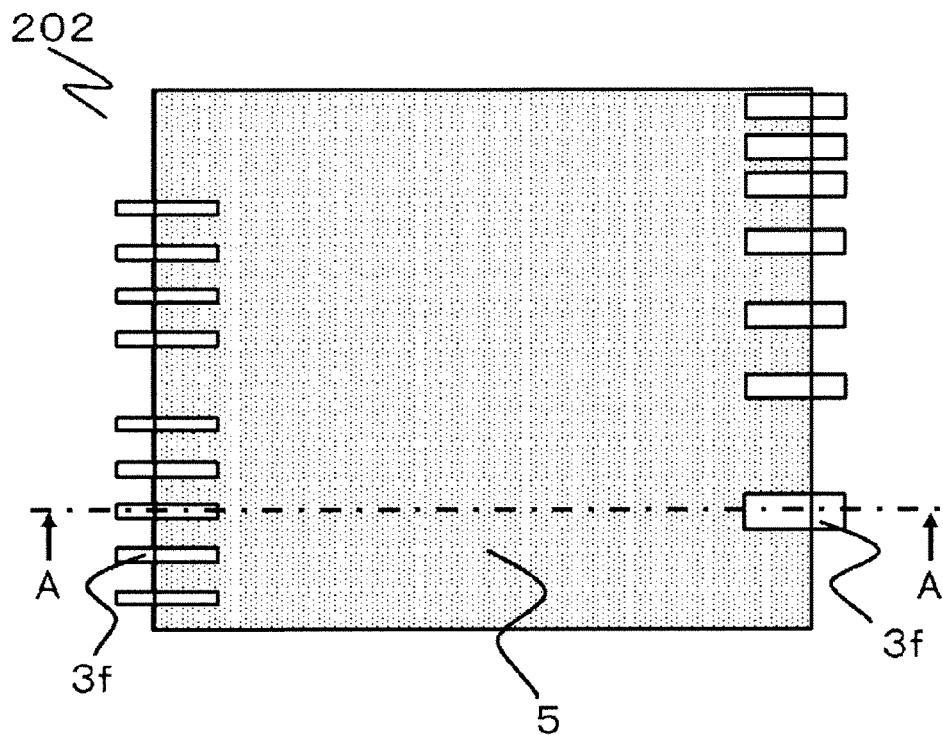
FIG. 1 is a plan view of a semiconductor device according to Embodiment 1.

A configuration of a semiconductor device according to Embodiment 1 will be described. FIG. 1 is a plan view of the semiconductor device according to Embodiment 1, and FIG. 2 is a cross-sectional view along the line A-A of FIG. 1.

Figure 2:
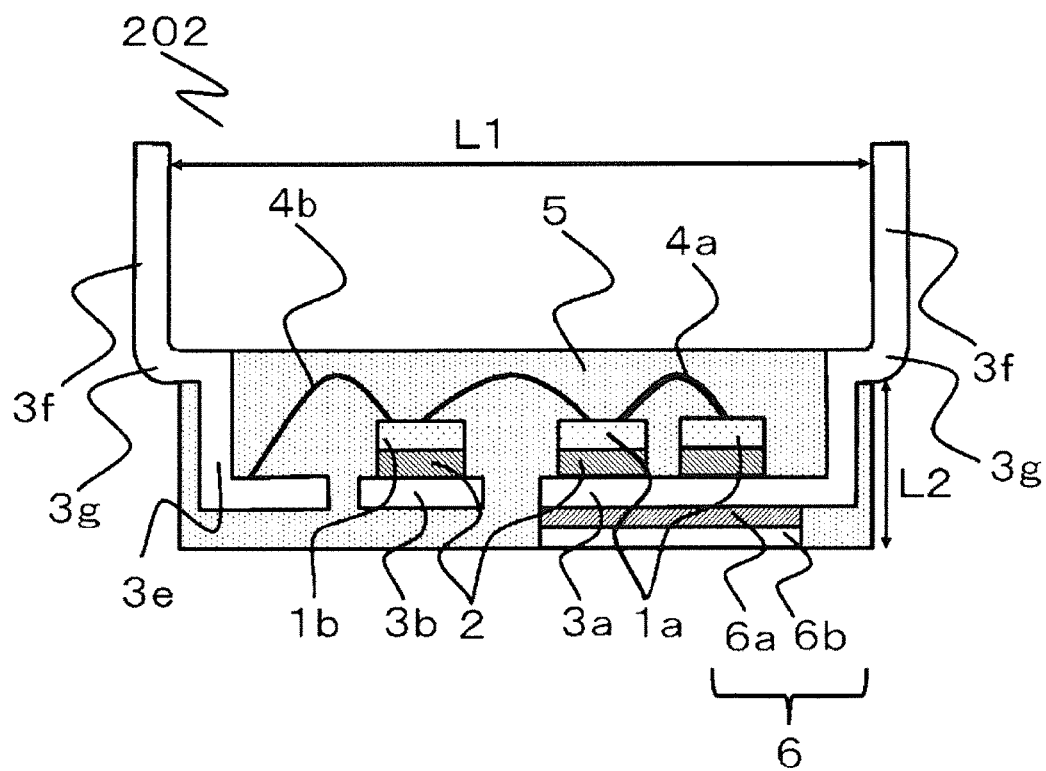
FIG. 2 is a cross-sectional view of the semiconductor device according to Embodiment 1.

As shown in FIGS. 1 and 2, the semiconductor device 202 includes semiconductor elements 1a, semiconductor elements 1b, joining materials 2, inner leads 3e having die pads 3a, outer leads 3f, metal wires 4a, metal wires 4b, a sealing resin 5, and an insulating heat dissipation plate 6.

The semiconductor elements 1a are power semiconductor elements. The semiconductor elements 1a are, for example, insulated gate bipolar transistors (IGBTs), metal oxide semiconductor field effect transistors (MOSFETs), and freewheeling diodes (FWDs) formed of silicon (Si). One side of each of the semiconductor elements 1a has a length of 3 mm to 13 mm in plan view.

The semiconductor elements 1a are mounted to upper surfaces of the die pads 3a through the joining materials 2. Two semiconductor elements 1a are mounted to an upper surface of a die pad 3a through joining materials 2 in FIG. 2, but the number of semiconductor elements 1a is not limited to two, and the required number of semiconductor elements 1a can be mounted in accordance with a specification of the semiconductor device 202.

The upper surfaces of the die pads 3a refer to surfaces to which the semiconductor elements 1a are mounted. For example, a direction on a side of the upper surfaces of the die pads 3a indicates an upward direction on the page of FIG. 2.

The semiconductor elements 1b are control integrated circuits (ICs) to control the semiconductor elements 1a. The semiconductor elements 1b are mounted to upper surfaces of die pads 3b through the joining materials 2.

The upper surfaces of the die pads 3b refer to surfaces to which the semiconductor elements 1b are mounted. For example, a direction on a side of the upper surfaces of the die pads 3b indicates an upward direction on the page of FIG. 2.

The joining materials 2 join lower surfaces of the semiconductor elements 1a and the upper surfaces of the die pads 3a, and join lower surfaces of the semiconductor elements 1b and the upper surfaces of the die pads 3b. The joining materials 2 are solder materials including tin (Sn).

The joining materials 2 may be sintered materials including silver (Ag) or copper (Cu) or adhesives capable of dissipating heat generated by the semiconductor elements 1a. Use of the sintered materials as the joining materials 2 allows the joining materials 2 to have high reliability and long lives as they have excellent heat resistance, and can suppress development of cracking against thermal stress and thermal strain generated due to coefficients of linear thermal expansion of the semiconductor elements 1a and the die pads 3a.

Figure 4:
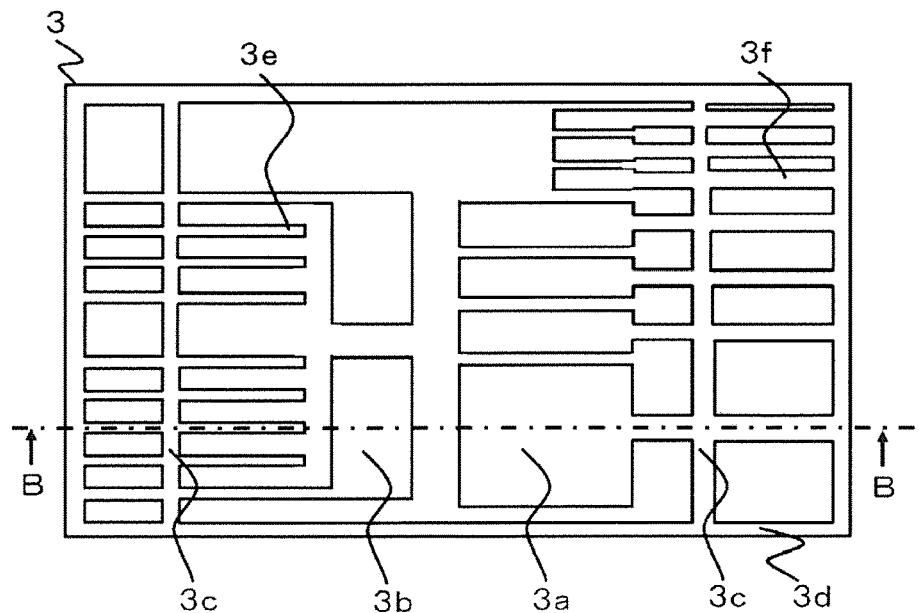
FIG. 4 is a plan view showing a state after a member preparation step of preparing a lead frame of the semiconductor device manufacturing method according to Embodiment 1.

The inner leads 3e having the die pads 3a and the die pads 3b, tie bars 3c, a framework 3d, and the outer leads 3f are integrally connected to one another as a single lead frame 3 as shown in FIG. 4. Thus, the inner leads 3e having the die pads 3a and the die pads 3b, the tie bars 3c, the framework 3d, and the outer leads 3f are formed of the same material, and have the same thickness.

A material for the inner leads 3e having the die pads 3a and the die pads 3b, the tie bars 3c, the framework 3d, and the outer leads 3f includes copper (Cu), but is not limited to the material including copper, and may be any material having required conductivity and heat dissipation. The material may be an alloy including copper (Cu) or aluminum (Al), or a layered composite material, for example.

The lead frame 3 including the inner leads 3e having the die pads 3a and the die pads 3b, the tie bars 3c, the framework 3d, and the outer leads 3f has a thickness of 0.3 mm to 0.8 mm.

The upper surfaces of the die pads 3a and the die pads 3b may be silver (Ag) plated to improve joining to the joining materials 2. Silver plating may be replaced with gold (Au) plating or tin (Sn) plating. The above-mentioned plating has a thickness of 0.001 mm to 0.002 mm.

At least portion of the inner leads 3e may have microscopic surface irregularities to improve adhesion to the sealing resin 5. Priming can improve adhesion of the inner leads 3e to the sealing resin 5 to thereby secure insulation.

The inner leads 3e are located within the sealing resin 5, and each have a stepped profile. The inner leads 3e have the die pads 3a as mounts for the semiconductor elements 1a and the die pads 3b as mounts for the semiconductor elements 1b.

On the page of FIG. 2, the die pads 3a and the die pads 3b are located at the same step level, but the locations of the die pads 3a and the die pads 3b are not limited to these locations. That is to say, the die pads 3a and the die pads 3b may be located at different step levels. As shown in FIGS. 1 and 2, surfaces of portions of the inner leads 3e are exposed from an upper surface (on an upper side on the page of FIG. 2) of the sealing resin 5 in plan view.

The outer leads 3f are electrically and structurally connected to the inner leads 3e. The outer leads 3f protrude from opposing side surfaces of the sealing resin 5. The outer leads 3f have first bends 3g at the side surfaces of the sealing resin 5 to thereby extend along the side surfaces of the sealing resin 5 in the direction on the side of the upper surfaces of the die pads 3a.

That is to say, the outer leads 3f are connected to the inner leads 3e, and, as shown in FIG. 2, protrude from the opposing side surfaces of the sealing resin 5, are bent at the side surfaces of the sealing resin 5, and extend in the direction on the side of the upper surfaces of the die pads 3a.

The metal wires 4a and the metal wires 4b are metals including any of aluminum (Al), copper (Cu), silver (Ag), and gold (Au). The metal wires 4a and the metal wires 4b are joined by pressurization and ultrasonic vibration, and electrically wire the semiconductor elements 1a, the semiconductor elements 1b, and the inner leads 3e.

Materials for the metal wires 4a and the metal wires 4b, diameters of the metal wires 4a and the metal wires 4b, and the number of metal wires 4a and metal wires 4b correspond to required current-carrying capacities. For example, the metal wires 4a are required to have large current-carrying capacities, and thus each have a diameter of 0.1 mm to 0.5 mm. On the other hand, since the semiconductor elements 1b are the control ICs, the metal wires 4b have small current-carrying capacities, and joining areas for wiring using the metal wires 4b are small. The metal wires 4b thus each have a diameter of 0.02 mm to 0.08 mm.

The sealing resin 5 includes an epoxy resin having thermosetting properties, but the sealing resin 5 is not limited to the epoxy resin, and may be any thermosetting resin having a desired elastic modulus and desired adhesion. Sealing with the sealing resin 5 is performed by transfer molding.

The insulating heat dissipation plate 6 is a plate having insulation and heat dissipation. The insulating heat dissipation plate 6 adheres to lower surfaces of the die pads 3a, that is, surfaces of the die pads 3a opposite the surfaces on which the joining materials 2 are located, and dissipate heat generated by the semiconductor elements 1a through the die pads 3a.

The insulating heat dissipation plate 6 has a double layer structure of an insulating layer 6a and a metal layer 6b, and a lower surface of the metal layer 6b, that is, a surface of the metal layer 6b opposite the surface on which the insulating layer 6a is located is exposed from the sealing resin 5. The insulating heat dissipation plate 6 has a thermal conductivity of 2 W/(m·K) to 18 W/(m·K) and a thickness of 0.1 mm to 0.2 mm. The insulating layer 6a includes an epoxy resin including any of alumina ($Al_2O_3$), aluminum nitride (AlN), silicon nitride ($Si_3N_4$), silicon dioxide ($SiO_2$), and boron nitride (BN), and filled with a filler, for example.

The metal layer 6b includes a metal including copper (Cu) or aluminum (Al), and having excellent thermal conductivity.

When an operating temperature of the semiconductor elements 1a exceeds a rated value due to usage conditions of the semiconductor device 202, performance of the semiconductor elements 1a is reduced, and, at worst, thermal runaway occurs to break the semiconductor elements 1a. The insulating heat dissipation plate 6 is thus required to have high heat dissipation in some cases, and heat dissipation can be improved by causing the metal layer 6b to have a thickness of 1 mm to 3 mm.

Although not illustrated, a cooler can be attached, through thermal grease, to a lower surface of the insulating heat dissipation plate 6, that is, a surface of the insulating heat dissipation plate 6 opposite the surface on which the die pads 3a are located. A material for the cooler is a metal including aluminum (Al) and having excellent thermal conductivity, and the cooler includes a plurality of fins.

According to the forgoing, in the semiconductor device 202, the semiconductor elements 1a are mounted to the upper surfaces of the die pads 3a through the joining materials 2, and the semiconductor elements 1b are mounted to the upper surfaces of the die pads 3b through the joining materials 2. The metal wires 4a and the metal wires 4b electrically wire the semiconductor elements 1a, the semiconductor elements 1b, and the inner leads 3e. The insulating heat dissipation plate 6 adheres to the lower surfaces of the die pads 3a, and dissipates heat generated by the semiconductor elements 1a.

While the semiconductor elements 1a, the semiconductor elements 1b, the die pads 3a, the die pads 3b, and the inner leads 3e are sealed with the sealing resin 5, the portions of the inner leads 3e are exposed from the sealing resin 5.

That is to say, as shown in FIG. 2, the surfaces of the portions of the inner leads 3e located on a left side and a right side on the page of FIG. 2 are exposed, from the upper surface of the sealing resin 5, parallel to the upper surface of the sealing resin 5. The outer leads 3f connected to the inner leads 3e protrude from the opposing side surfaces of the sealing resin 5, have the first bends 3g at the side surfaces of the sealing resin 5, are bent at substantially right angles, and extend in the direction on the side of the upper surfaces of the die pads 3a.

One side of the semiconductor device 202 has a length of 15 mm to 130 mm in plan view.

It is required to fix the semiconductor device 202 to bend the outer leads 3f using a lead forming die (not illustrated). Bending using the lead forming die (not illustrated) is typically performed while portions of the outer leads 3f near the locations where the outer leads 3f protrude from the side surfaces of the sealing resin 5 are fixed by a clamping fixture (not illustrated). The first bends 3g thus cannot be provided at the side surfaces of the sealing resin 5.

Fixing the sealing resin 5 is the only way to provide the first bends 3g at the side surfaces of the sealing resin 5. If bending using the lead forming die (not illustrated) is performed while the sealing resin 5 is fixed, however, large stress can be applied to the sealing resin 5 to cause cracking of the sealing resin 5 as the sealing resin 5 is formed of a resin.

In the semiconductor device 202, however, the surfaces of the portions of the inner leads 3e connected to the outer leads 3f are exposed from the sealing resin 5 as described above.

Figure 14:
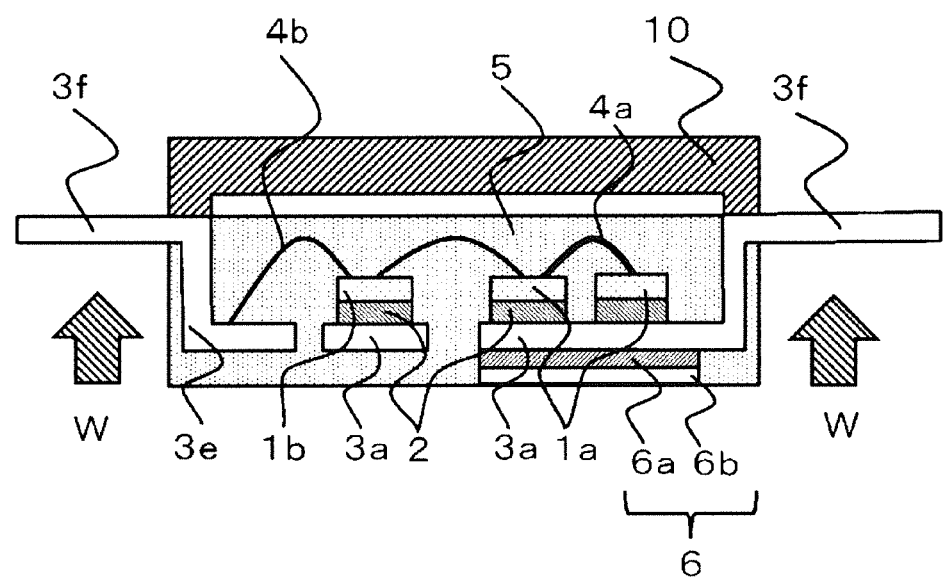
FIG. 14 is a cross-sectional view showing a state of a lead forming step of bending outer leads of the semiconductor device manufacturing method according to Embodiment 1.

Thus, when the outer leads 3f are bent using the lead forming die (not illustrated), a fixture 10 can be brought into contact with and fixed to the portions of the inner leads 3e exposed from the sealing resin 5 as shown in FIG. 14, so that the outer leads 3f can be bent at the side surfaces of the sealing resin 5.

Thus, the first bends 3g can be provided at the side surfaces of the sealing resin 5 without causing cracking of the sealing resin 5, and the outer leads 3f can be bent to extend in the direction on the side of the upper surfaces of the die pads 3a.

Furthermore, as shown in FIG. 2, the first bends 3g are provided at the side surfaces of the sealing resin 5, and a distance L1 between the outer leads 3f extending from the opposing side surfaces of the sealing resin 5 can be reduced.

As described above, the surfaces of the portions of the inner leads 3e are exposed from the sealing resin 5, and the outer leads 3f protrude from the opposing side surfaces of the sealing resin 5, and have the first bends 3g to extend, so that the distance L1 between the outer leads 3f can be reduced. The semiconductor device 202 including the outer leads 3f can thereby be miniaturized. The layout area for implementation of the semiconductor device 202 on a control substrate can be reduced.

Furthermore, the outer leads 3f protrude from the opposing side surfaces of the sealing resin 5, so that there is no need to newly prepare a mold 7 having a slit as disclosed in Japanese Patent Application Laid-Open No. H10-223825 (paragraphs 0030, 0032 to 0033, 0036, and FIGS. 9 and 11) in a sealing step. Sealing can be performed using the conventional mold 7 having been used so far, so that frequency of replacement of the mold 7 with the new mold 7 and an increase in burden of maintenance of the mold 7 can be suppressed, and thus the semiconductor device 202 can be obtained with high productivity.

A semiconductor device manufacturing method will be described next.

Figure 3:
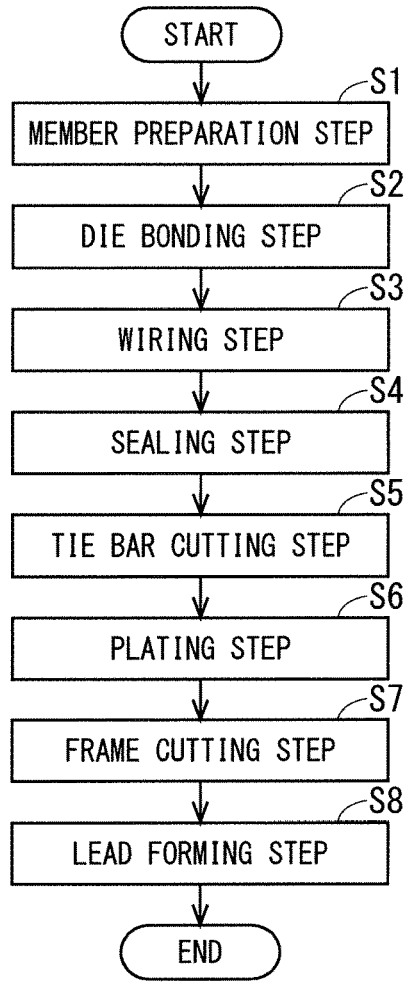
FIG. 3 is a flowchart showing a semiconductor device manufacturing method according to Embodiment 1.

FIG. 3 is a flowchart relating to the semiconductor device manufacturing method.

A member preparation step (S1) of the semiconductor device manufacturing method will be described. FIG. 4 is a plan view showing a state after the member preparation step of preparing the lead frame, and FIG. 5 is a cross-sectional view along the line B-B of FIG. 4.

Figure 5:
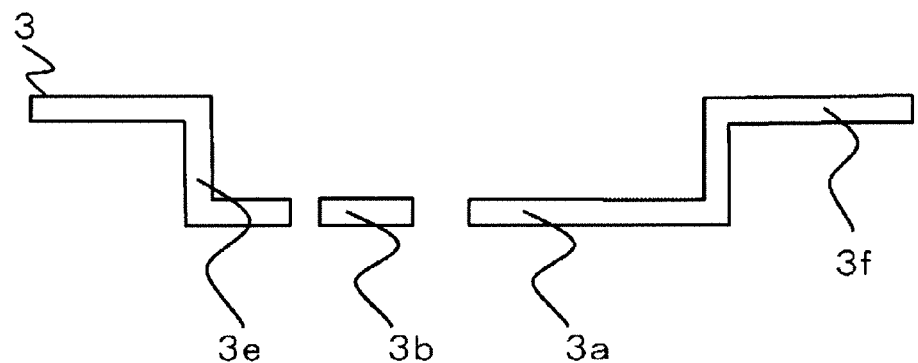
FIG. 5 is a cross-sectional view showing the state after the member preparation step of preparing the lead frame of the semiconductor device manufacturing method according to Embodiment 1.

As shown in FIGS. 4 and 5, the single lead frame 3 including the inner leads 3e having the die pads 3a and the die pads 3b, the tie bars 3c, the framework 3d, and the outer leads 3f is prepared (S1).

The tie bars 3c connect the outer leads 3f in a direction orthogonal to the outer leads 3f. The framework 3d is a peripheral portion of the lead frame 3, and connects the outer leads 3f and the tie bars 3c. As shown in FIG. 5, the inner leads 3e each have a stepped profile. The stepped profile of each of the inner leads 3e is formed by pressing.

The lead frame 3 shown in FIG. 4 is that for a single semiconductor device 202, but the lead frame 3 can include a plurality of semiconductor devices 202. The plurality of semiconductor devices 202 can be obtained by collective and simultaneous sealing in a sealing step (S4) described below, allowing for high productivity.

Figure 6:
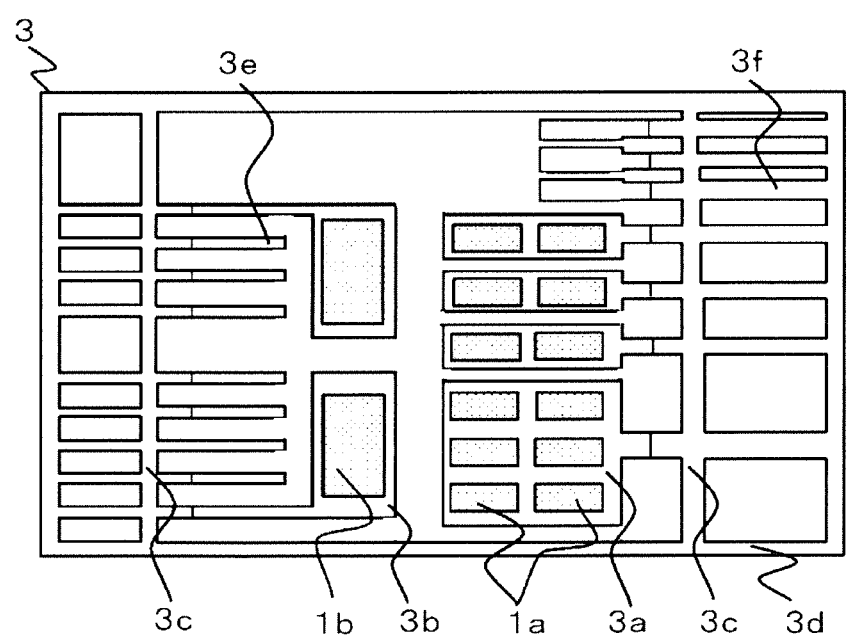
FIG. 6 is a plan view showing a state after a die bonding step of mounting semiconductor elements of the semiconductor device manufacturing method according to Embodiment 1.

A die bonding step (S2) of the semiconductor device manufacturing method will be described. FIG. 6 is a plan view showing a state after the die bonding step of mounting the semiconductor elements 1a and the semiconductor elements 1b.

The semiconductor elements 1a are mounted to the upper surfaces of the die pads 3a through the joining materials 2. Similarly, the semiconductor elements 1b are mounted to the upper surfaces of the die pads 3b through the joining materials 2. The joining materials 2 may be pastes or sheets. The semiconductor elements 1a and the semiconductor elements 1b can collectively and simultaneously be joined by reflow.

Figure 7:
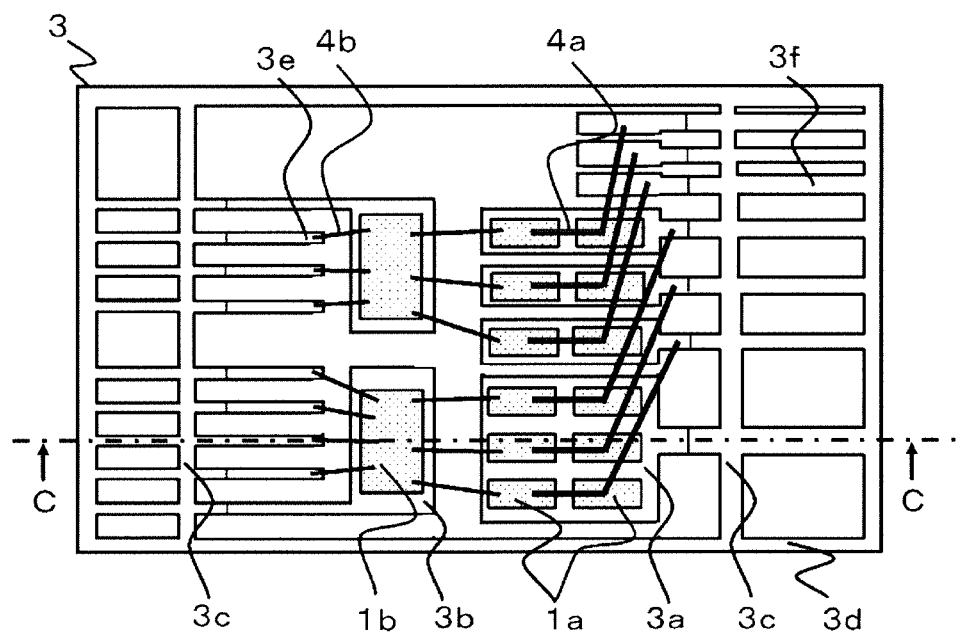
FIG. 7 is a plan view showing a state after a wiring step of performing wiring using metal wires of the semiconductor device manufacturing method according to Embodiment 1.
Figure 8:
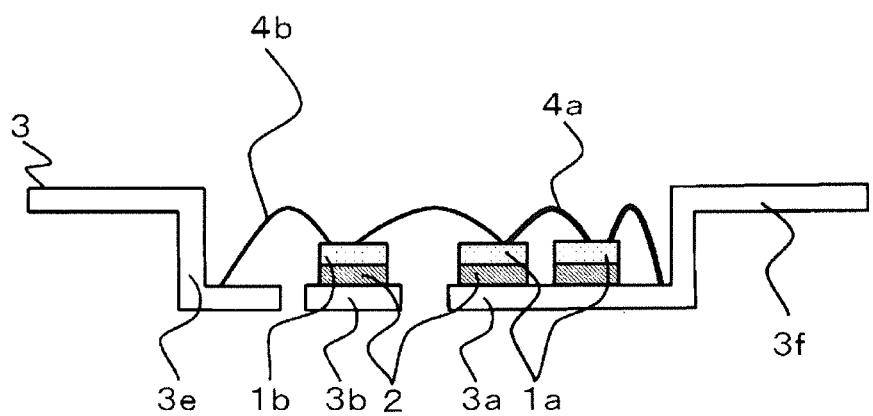
FIG. 8 is a cross-sectional view showing the state after the wiring step of performing wiring using the metal wires of the semiconductor device manufacturing method according to Embodiment 1.

A wiring step (S3) of the semiconductor device manufacturing method will be described. FIG. 7 is a plan view showing a state after the wiring step of performing wiring using the metal wires 4a and the metal wires 4b, and FIG. 8 is a cross-sectional view along the line C-C of FIG. 7.

The metal wires 4a wire the semiconductor elements 1a and the inner leads 3e, and the metal wires 4b wire the semiconductor elements 1b, the semiconductor elements 1a, and the inner leads 3e. In a wiring method, an ultrasonic tool (not illustrated) applies ultrasonic vibration while performing pressurization to ultrasonically join the metal wires 4a and the metal wires 4b.

The number of directions of ultrasonic vibration may be one or two. Ultrasonic joining is performed while the lead frame 3 is heated under an inert atmosphere including nitrogen ($N_2$) as necessary to obtain wiring having a high joining strength and high reliability.

Figure 9:
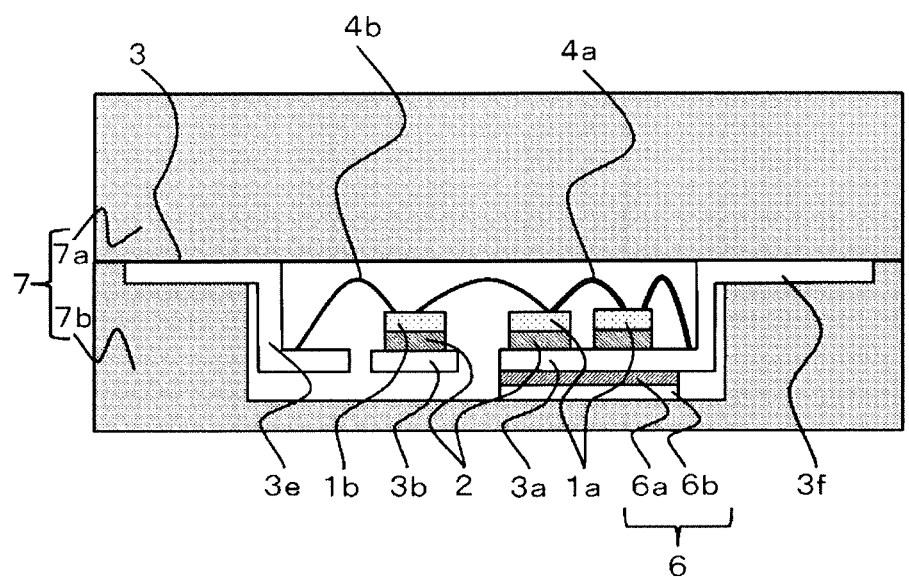
FIG. 9 is a cross-sectional view showing a sealing step of performing sealing with a resin of the semiconductor device manufacturing method according to Embodiment 1.

The sealing step (S4) of the semiconductor device manufacturing method will be described. FIG. 9 is a cross-sectional view showing the sealing step (S4) of performing sealing with a resin.

A sealing method is transfer molding performed using a mold. The mold 7 includes a pair of an upper mold 7a and a lower mold 7b, and heaters (not illustrated) are embedded in the upper mold 7a and the lower mold 7b. The heaters (not illustrated) raise the temperatures of the upper mold 7a and the lower mold 7b. The lead frame 3 and the insulating heat dissipation plate 6 having completed the wiring step (S3) are placed in an internal space of the mold 7 including the upper mold 7a and the lower mold 7b, and a thermosetting resin is injected into the internal space of the mold 7 through a gate (not illustrated) as a resin inlet provided between the upper mold 7a and the lower mold 7b.

The sealing step (S4) is completed by performing post-curing due to heating after injection of the resin to completely cure the sealing resin 5.

Figure 10:
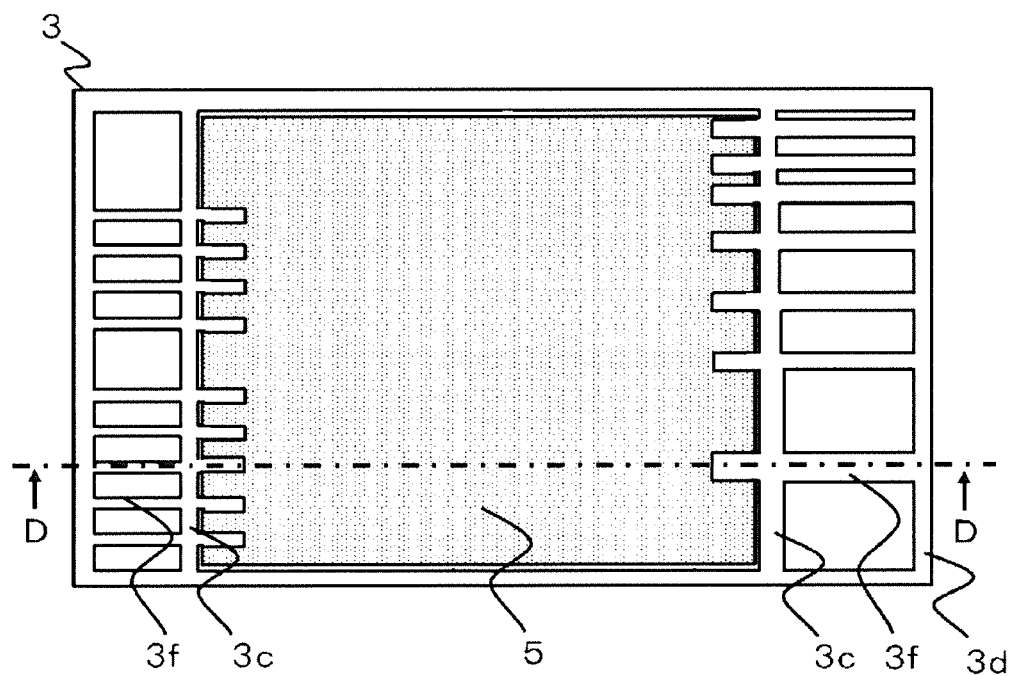
FIG. 10 is a plan view showing a state after the sealing step of performing sealing with the resin of the semiconductor device manufacturing method according to Embodiment 1.
Figure 11:
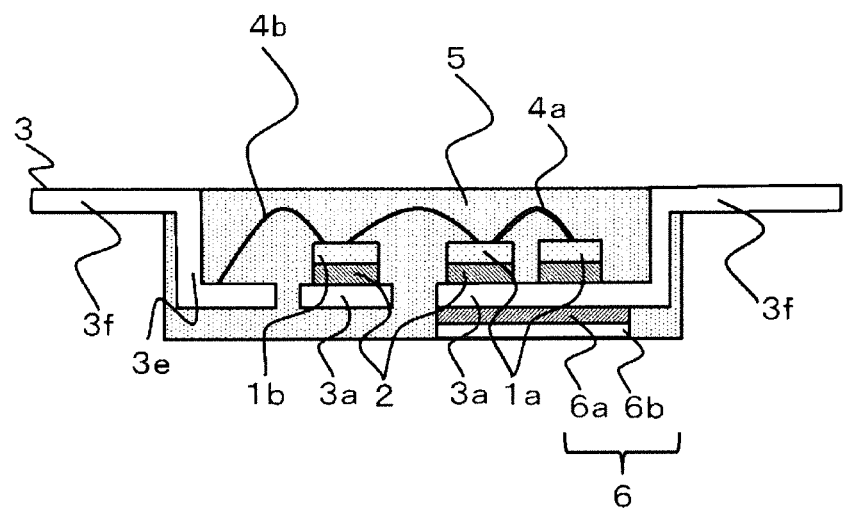
FIG. 11 is a cross-sectional view showing the state after the sealing step of performing sealing with the resin of the semiconductor device manufacturing method according to Embodiment 1.

FIG. 10 is a plan view showing a state after the sealing step of performing sealing with the resin, and FIG. 11 is a cross-sectional view along the line D-D of FIG. 10. The inner leads 3e are sealed with the thermosetting resin, and are located within the sealing resin 5, but, as shown in FIGS. 10 and 11, the surfaces of the portions of the inner leads 3e are sealed to be exposed from the upper surface of the sealing resin 5 in plan view.

In the sealing step (S4), the insulating heat dissipation plate 6 is transfer molded, and can adhere to the lower surfaces of the die pads 3a due to heating from the mold 7 having the raised temperature, allowing for extremely high productivity.

Figure 12:
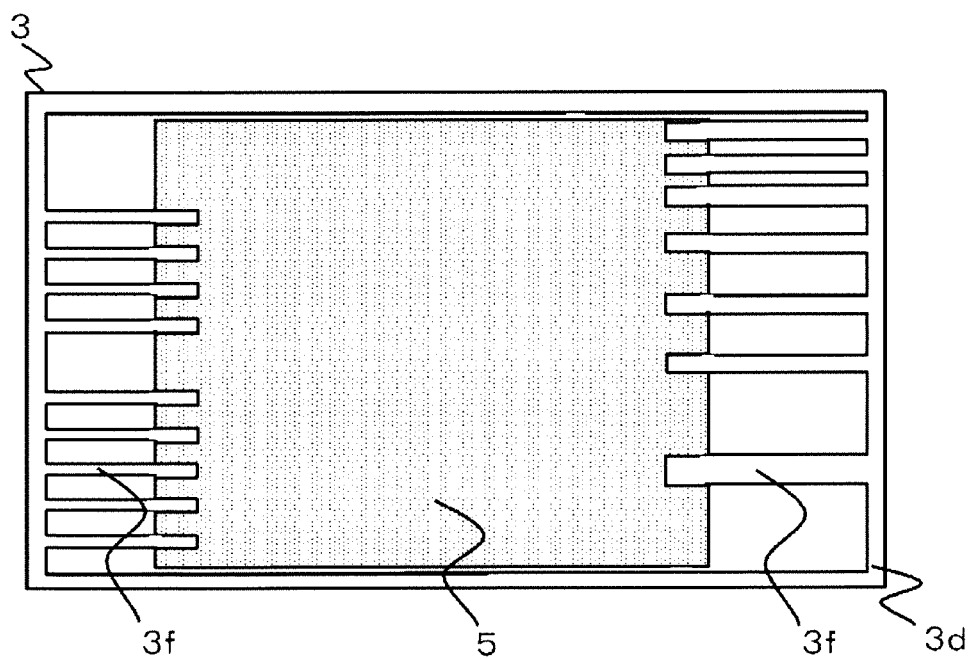
FIG. 12 is a plan view showing a state after a tie bar cutting step of cutting tie bars of the semiconductor device manufacturing method according to Embodiment 1.

A tie bar cutting step (S5) and a plating step (S6) of the semiconductor device manufacturing method will be described. FIG. 12 is a plan view showing a state after the tie bar cutting step of cutting the tie bars.

The tie bars 3c are cut and removed by shearing using a tie bar cutting die (not illustrated). The outer leads 3f, the surfaces of the portions of the inner leads 3e exposed from the sealing resin 5, and the framework 3d are then plated in the plating step (S6). A plating material is tin (Sn) or an alloy including tin (Sn).

Figure 13:
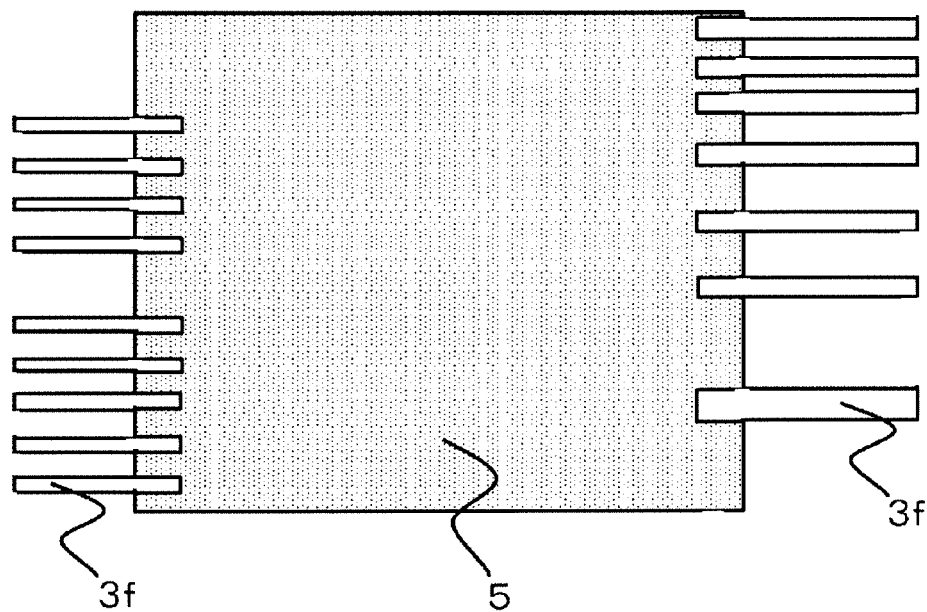
FIG. 13 is a plan view showing a state after a frame cutting step of cutting a framework of the semiconductor device manufacturing method according to Embodiment 1.

A frame cutting step (S7) of the semiconductor device manufacturing method will be described. FIG. 13 is a plan view showing a state after the frame cutting step of cutting the framework 3d. The framework 3d is cut and removed by shearing using a frame cutting die (not illustrated).

A lead forming step (S8) of the semiconductor device manufacturing method will be described. FIG. 14 is a cross-sectional view showing a state of the lead forming step (S8) of bending the outer leads 3f.

The fixture 10 is brought into contact with and fixed to the portions of the inner leads 3e connected to the outer leads 3f and exposed from the sealing resin 5. The outer leads 3f are subjected to a load in a direction of arrows W shown in FIG.

14 by the lead forming die (not illustrated). The first bends 3g are thereby provided at the side surfaces of the sealing resin 5, and the outer leads 3f protruding from the side surfaces of the sealing resin 5 are bent and extend in the direction on the side of the upper surfaces of the die pads 3a along the side surfaces of the sealing resin 5.

As a result, the outer leads 3f can be bent at substantially right angles at the first bends 3g provided at the side surfaces of the sealing resin 5 without causing cracking of the sealing resin 5.

The outer leads 3f may be bent by roller bending or cam bending.

Even if the locations where the outer leads 3f are arranged vary with a specification of the semiconductor device 202, sealing can be performed using the same mold 7 as only arrangement and the shapes of the inner leads 3e and the outer leads 3f vary. The lead forming die (not illustrated) can easily be adjusted, so that the outer leads 3f can be bent to have the first bends 3g at the side surfaces of the sealing resin 5 to extend in the direction on the side of the upper surfaces of the die pads 3a.

As described above, according to the semiconductor device manufacturing method, the surfaces of the portions of the inner leads 3e are exposed from the sealing resin 5, and the outer leads 3f protrude from the opposing side surfaces of the sealing resin 5, and have the first bends 3g to extend, so that the distance L1 between the outer leads 3f can be reduced. The semiconductor device 202 including the outer leads 3f can thereby be miniaturized. The layout area for implementation of the semiconductor device 202 on the control substrate can be reduced.

Furthermore, the outer leads 3f protrude from the opposing side surfaces of the sealing resin 5, so that there is no need to newly prepare the mold 7 having the slit as disclosed in Japanese Patent Application Laid-Open No. H10-223825 (paragraphs 0030, 0032 to 0033, 0036, and FIGS. 9 and 11) in the sealing step (S4). Sealing can be performed using the conventional mold 7 having been used so far, so that the frequency of replacement of the mold 7 with the new mold 7 and the increase in burden of maintenance of the mold 7 can be suppressed, and thus the semiconductor device manufacturing method allows for high productivity.

In Embodiment 1, the semiconductor elements 1a are mounted to the upper surfaces of the die pads 3a through the joining materials 2, and the semiconductor elements 1b are mounted to the upper surfaces of the die pads 3b through the joining materials 2. The metal wires 4a and the metal wires 4b electrically wire the semiconductor elements 1a, the semiconductor elements 1b, and the inner leads 3e. The insulating heat dissipation plate 6 adheres to the lower surfaces of the die pads 3a, and dissipates heat generated by the semiconductor elements 1a.

The semiconductor elements 1a, the semiconductor elements 1b, the die pads 3a, the die pads 3b, and the inner leads 3e are sealed with the sealing resin 5, but the surfaces of the portions of the inner leads 3e are exposed from the sealing resin 5.

The outer leads 3f connected to the inner leads 3e protrude from the opposing side surfaces of the sealing resin 5, have the first bends 3g at the side surfaces of the sealing resin 5, are bent at substantially right angles, and extend in the direction on the side of the upper surfaces of the die pads 3a.

With a configuration as described above, the semiconductor device 202 as easily miniaturized can be obtained. Furthermore, the layout area of the semiconductor device 202 implemented on the control substrate can be reduced.

The semiconductor device 202 can be 8% to 20% smaller than a semiconductor device as disclosed in Japanese Patent Application Laid-Open No. S62-229865 (the 5th line in the lower right column on page 2 to the 6th line in the upper left column on page 3, and FIGS. 1 to 5).

There is no need to newly prepare the mold 7 having the slit as disclosed in Japanese Patent Application Laid-Open No. H10-223825 (paragraphs 0030, 0032 to 0033, 0036, and FIGS. 9 and 11), and sealing can be performed using the conventional mold 7 having been used so far, allowing for high productivity.

The portions of the inner leads 3e are exposed from the upper surface of the sealing resin 5 in plan view, and the outer leads 3f protrude from the opposing side surfaces of the sealing resin 5 as shown in FIG. 2, so that a sufficient insulating distance can be secured as a distance L2 from an interface between the metal layer 6b of the insulating heat dissipation plate 6 and the cooler (not illustrated) attached to the insulating heat dissipation plate 6 to the first bends 3g.

Figure 15:
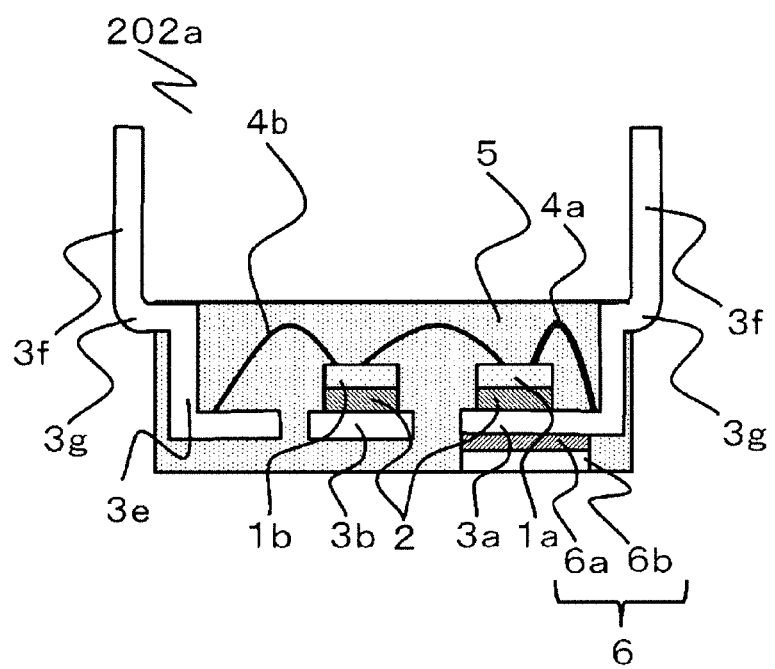
FIG. 15 is a cross-sectional view of a semiconductor device including RC-IGBTs as the semiconductor elements according to Embodiment 1.

Furthermore, each of the semiconductor elements 1a may be a reverse conducting insulated gate bipolar transistor (an RC-IGBT) including an IGBT and a freewheeling diode formed as a single piece. FIG. 15 is a cross-sectional view of a semiconductor device 202a including RC-IGBTs as the semiconductor elements 1a.

Since a pair of the IGBT and the FWD can be replaced with a single RC-IGBT, the area of the die pads 3a required to mount the semiconductor elements 1a can significantly be reduced. The size of the sealing resin 5 is thus reduced, so that the semiconductor device 202a can be miniaturized. The layout area of the semiconductor device 202a implemented on the control substrate can be reduced.

The semiconductor elements 1a may each include a so-called wide bandgap semiconductor formed of a material such as silicon carbide (SiC), gallium nitride (GaN), and diamond, and having a wider bandgap than silicon (Si).

Use of the elements each including the wide bandgap semiconductor allows for reduction in size of the semiconductor elements 1a as they can reduce power loss and perform high temperature operation compared with those including silicon (Si). That is to say, the area of the die pads 3a can be reduced to thereby reduce the size of the sealing resin 5, so that the semiconductor device 202 can be miniaturized. The layout area of the semiconductor device 202 implemented on the control substrate can be reduced.

Figure 16:
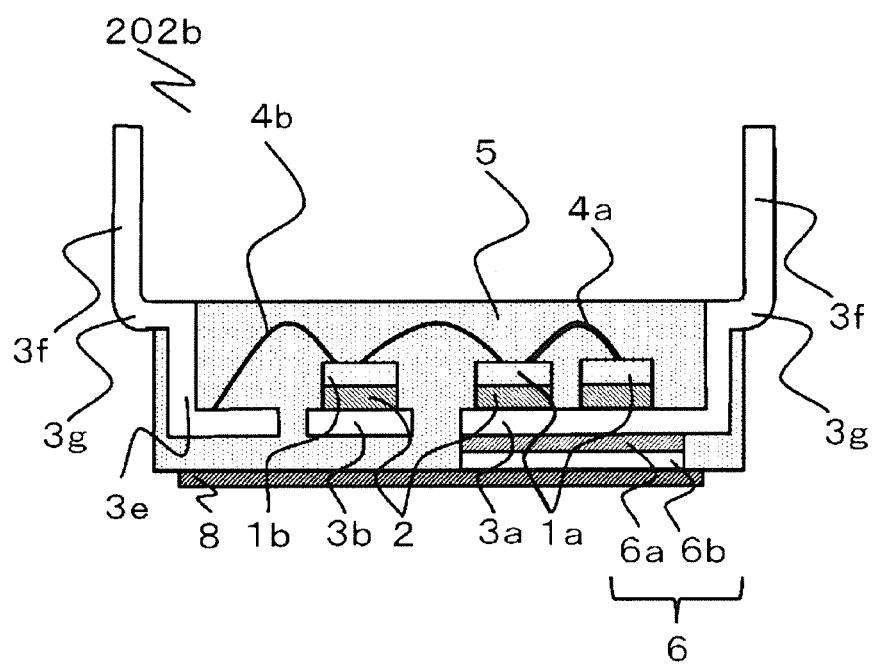
FIG. 16 is a cross-sectional view of a semiconductor device including a thermally conductive material according to Embodiment 1.

A thermally conductive material 8 may be provided on a lower side of the insulating heat dissipation plate 6, that is, the surface of the insulating heat dissipation plate 6 opposite the surface on which the die pads 3a are located. FIG. 16 is a cross-sectional view of a semiconductor device 202b including the thermally conductive material 8.

The thermally conductive material 8 is a plate-like thermal interface material (TIM). The thermally conductive material 8 allows the insulating heat dissipation plate 6 to efficiently dissipate heat generated by the semiconductor elements 1a to the cooler (not illustrated) attached to the insulating heat dissipation plate 6. The thermally conductive material 8 may be a graphite sheet, for example. Since the semiconductor device 202b involves a wide temperature change due to the semiconductor elements 1a, typical thermal grease can cause degradation due to pump-out, and increase thermal resistance.

The TIM, however, softens and undergoes a phase change with temperature, and thus can respond to the wide temperature change of the semiconductor device 202b, and maintain stable thermal resistance. The semiconductor device 202b can thereby maintain desired electrical properties.

The thermally conductive material 8 has a thickness of 0.03 mm to 0.2 mm. The thermally conductive material 8 can have high thermal conductivity by mixing therein a metal filler.

For convenience in production, the thermally conductive material 8 may be provided not only on the lower side of the insulating heat dissipation plate 6 but also on the entire surface to be in contact with the cooler (not illustrated) including a lower surface of the sealing resin 5 as shown in FIG. 16.

The semiconductor device 202b can be miniaturized by addressing concern about an increase in thermal resistance and securing sufficient heat dissipation at an interface between the semiconductor device 202b and the cooler (not illustrated). The layout area of the semiconductor device 202b implemented on the control substrate can be reduced.

Embodiment 2

Figure 17:
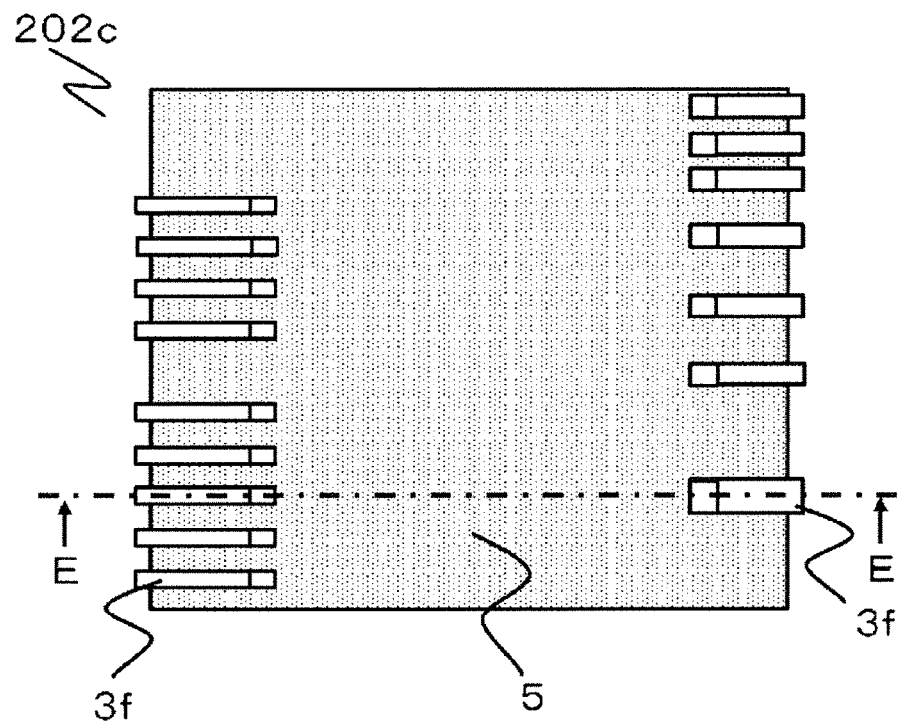
FIG. 17 is a plan view of a semiconductor device according to Embodiment 2.
Figure 18:
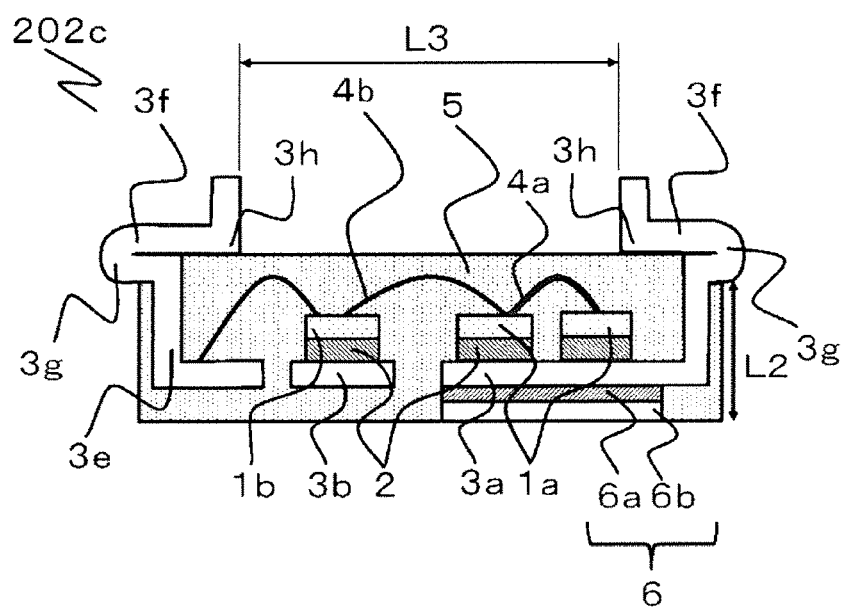
FIG. 18 is a cross-sectional view of the semiconductor device according to Embodiment 2.

FIG. 17 is a plan view of a semiconductor device 202c according to Embodiment 2, and FIG. 18 is a cross-sectional view along the line E-E of FIG. 17. The semiconductor device and a semiconductor device manufacturing method in the present embodiment have many components in common with those in Embodiment 1. Thus, only the difference from the semiconductor device and the semiconductor device manufacturing method in Embodiment 1 will be described, and the same or corresponding components bear the same reference sign, and description thereof will be omitted. The difference from Embodiment 1 is a configuration in which the outer leads 3f have second bends 3h in addition to the first bends 3g, and are arranged parallel to exposed surfaces of the inner leads 3e exposed from the sealing resin 5 as shown in FIGS. 17 and 18.

As shown in FIGS. 17 and 18, the inner leads 3e have the exposed surfaces being the surfaces of the portions of the inner leads 3e exposed from the upper surface of the sealing resin 5. The outer leads 3f protrude from the opposing side surfaces of the sealing resin 5. The outer leads 3f have the first bends 3g at the side surfaces of the sealing resin 5 to be arranged parallel to the exposed surfaces of the inner leads 3e. Furthermore, the outer leads 3f arranged parallel to the exposed surfaces of the inner leads 3e have the second bends 3h to extend in the direction on the side of the upper surfaces of the die pads 3a.

A plurality of portions of each of the outer leads 3f are bent. The second bends 3h are provided using a lead forming die (not illustrated) in the lead forming step of bending the outer leads 3f. The first bends 3g are then provided using the lead forming die (not illustrated) at the side surfaces of the sealing resin 5 so that the outer leads 3f are arranged parallel to the exposed surfaces of the inner leads 3e.

As described above, the outer leads 3f protrude from the opposing side surfaces of the sealing resin 5, have the first bends 3g at the side surfaces of the sealing resin 5, are arranged parallel to the exposed surfaces of the inner leads 3e exposed from the sealing resin 5, and extend in the direction on the side of the upper surfaces of the die pads 3a.

A distance L3 between the outer leads 3f extending in the direction on the side of the upper surfaces of the die pads 3a can thus be shorter than the distance L1 in Embodiment 1.

In Embodiment 2, the outer leads 3f connected to the inner leads 3e protrude from the opposing side surfaces of the sealing resin 5, have the first bends 3g at the side surfaces of the sealing resin 5, and are arranged parallel to the exposed surfaces being the surfaces of the portions of the inner lead 3e exposed from the upper surface of the sealing resin 5. Furthermore, the outer leads 3f arranged parallel to the exposed surfaces of the inner leads 3e have the second bends 3h, and extend in the direction on the side of the upper surfaces of the die pads 3a.

With a configuration as described above, the semiconductor device 202c as easily miniaturized can be obtained. Furthermore, the layout area of the semiconductor device 202c implemented on the control substrate can be reduced.

There is no need to newly prepare the mold 7 having the slit as disclosed in Japanese Patent Application Laid-Open No. H10-223825 (paragraphs 0030, 0032 to 0033, 0036, and FIGS. 9 and 11), and sealing can be performed using the conventional mold 7 having been used so far, allowing for high productivity.

The inner leads 3e have the exposed surfaces being the surfaces of the portions of the inner leads 3e exposed from the upper surface of the sealing resin 5 in plan view, and the outer leads 3f protrude from the opposing side surfaces of the sealing resin 5 as shown in FIG. 18, so that a sufficient insulating distance can be secured as the distance L2 from the interface between the metal layer 6b of the insulating heat dissipation plate 6 and the cooler (not illustrated) attached to the insulating heat dissipation plate 6 to the first bends 3g.

Figure 19:
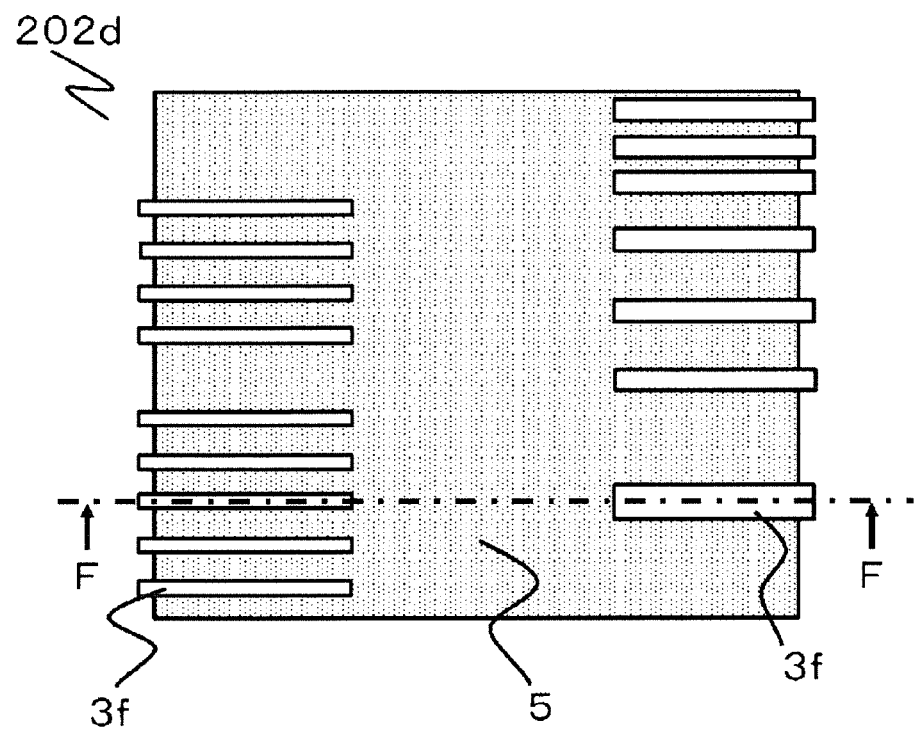
FIG. 19 is a plan view of a modification of the semiconductor device according to Embodiment 2.
Figure 20:
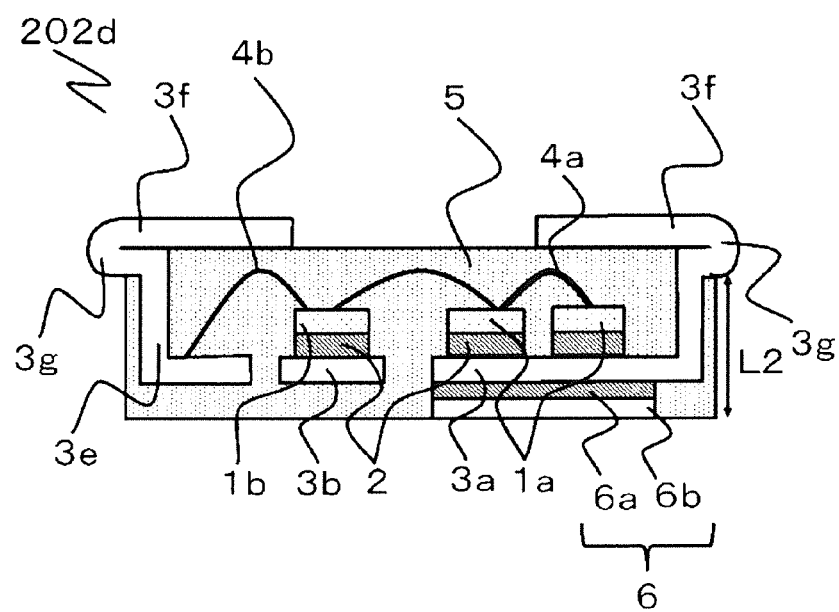
FIG. 20 is a cross-sectional view of the modification of the semiconductor device according to Embodiment 2.

As shown in FIGS. 19 and 20, the outer leads 3f may not have the second bends 3h. FIG. 19 is a plan view of a semiconductor device 202d in which the second bends 3h are not provided, and FIG. 20 is a cross-sectional view along the line F-F of FIG. 19.

The outer leads 3f can be surface implemented on the control substrate without being inserted into through holes of the control substrate. This improves heat dissipation from the outer leads 3f to the control substrate, and allows a high current to flow.

Embodiment 3

Figure 21:
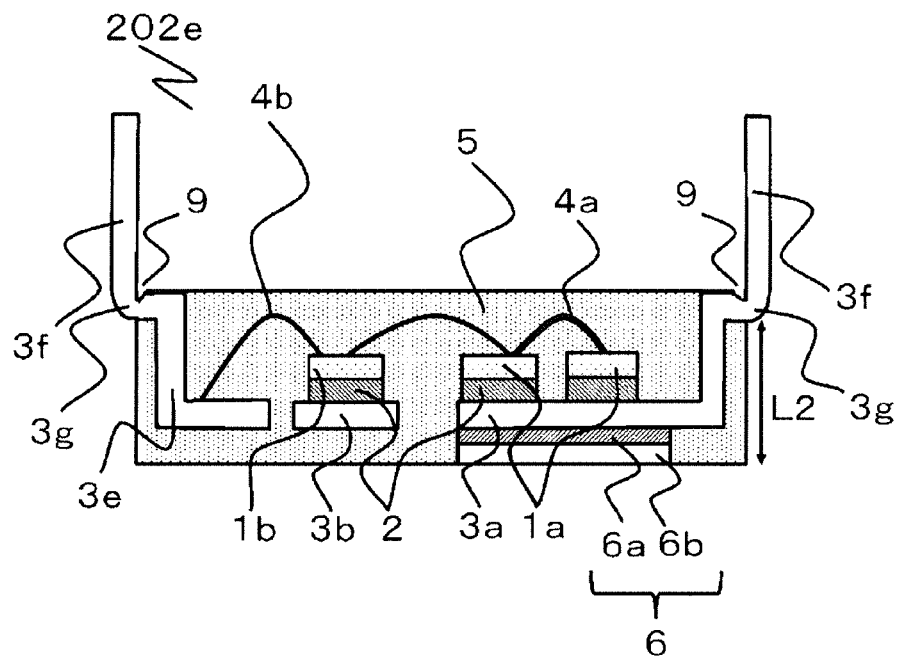
FIG. 21 is a cross-sectional view of a semiconductor device according to Embodiment 3.

FIG. 21 is a cross-sectional view of a semiconductor device 202e according to Embodiment 3. The semiconductor device and a semiconductor device manufacturing method in the present embodiment have many components in common with those in Embodiment 1. Thus, only the difference from the semiconductor device and the semiconductor device manufacturing method in Embodiment 1 will be described, and the same or corresponding components bear the same reference sign, and description thereof will be omitted. The difference from Embodiment 1 is a configuration in which the outer leads 3f have grooves 9 at the first bends 3g as shown in FIG. 21.

Figure 22:
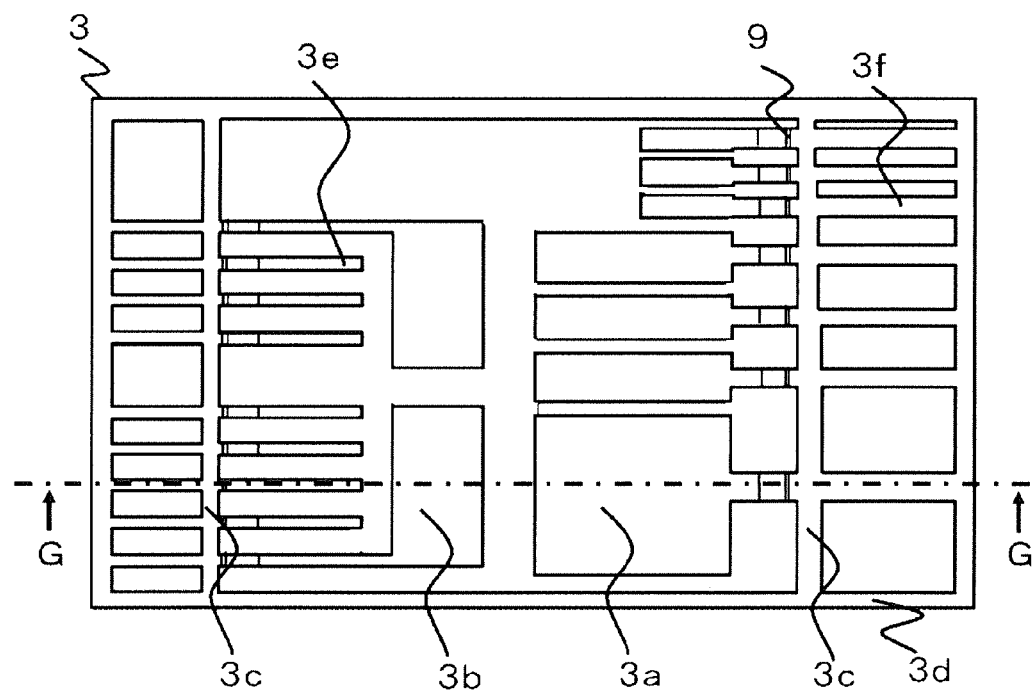
FIG. 22 is a plan view showing a state after the member preparation step of preparing the lead frame in a semiconductor device manufacturing method according to Embodiment 3.

FIG. 22 is a plan view showing a state after the member preparation step of preparing the lead frame 3 of the semiconductor device 202e. As shown in FIG. 22, the grooves 9 each having a depth of approximately 20% of the thickness of the lead frame 3 are provided by pressing in surfaces to be the first bends 3g and to be subjected to compressive stress when being bent. The grooves 9 can easily be provided by pressing, allowing for high productivity.

Figure 23:
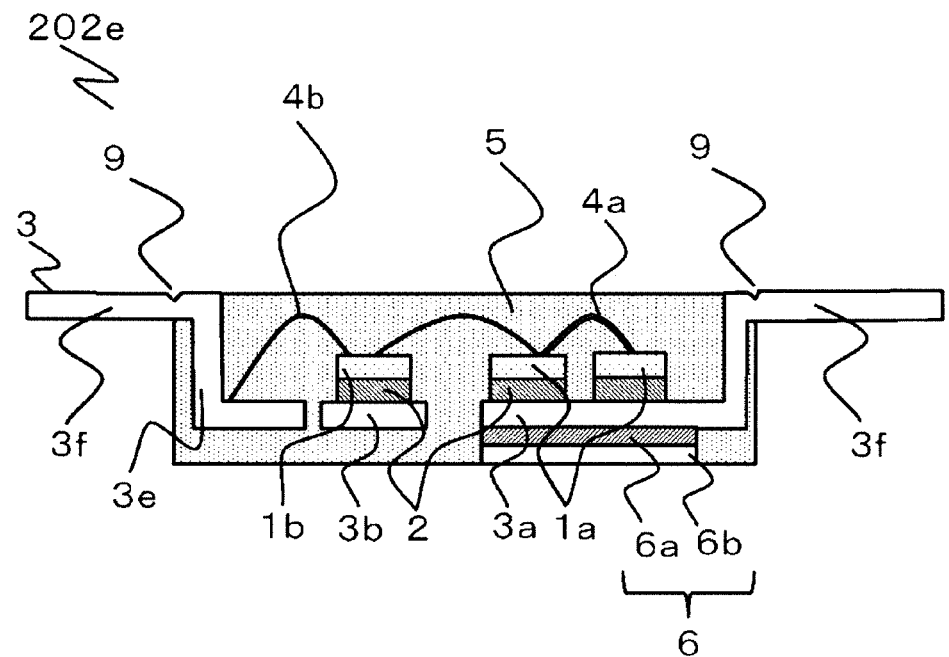
FIG. 23 is a cross-sectional view showing a state after the sealing step of performing sealing with the resin of the semiconductor device manufacturing method according to Embodiment 3.

FIG. 23 is a cross-sectional view showing a state after the sealing step of performing sealing of the semiconductor device 202e with the resin. As shown in FIG. 23, the grooves 9 are provided in the surfaces to be subjected to the compressive stress when being bent, so that the outer leads 3f can easily be bent with accuracy in the lead forming step (S8), allowing for high productivity.

When the semiconductor device 202e is implemented on the control substrate, misalignment of the outer leads 3f can be suppressed by bending with accuracy, and the semiconductor device 202e can easily be implemented.

Also in Embodiment 3, the outer leads 3f connected to the inner leads 3e protrude from the opposing side surfaces of the sealing resin 5, have, at the side surfaces of the sealing resin 5, the first bends 3g having the grooves 9 in the surfaces to be subjected to the compressive stress when being bent, are bent at substantially right angles, and extend in the direction on the side of the upper surfaces of the die pads 3a.

With a configuration as described above, the semiconductor device 202e as easily miniaturized can be obtained. The layout area of the semiconductor device 202e implemented on the control substrate can be reduced. Furthermore, the semiconductor device 202e can easily be positioned and implemented on the control substrate.

There is no need to newly prepare the mold 7 having the slit as disclosed in Japanese Patent Application Laid-Open No. H10-223825 (paragraphs 0030, 0032 to 0033, 0036, and FIGS. 9 and 11), and sealing can be performed using the conventional mold 7 having been used so far, allowing for high productivity.

The inner leads 3e have the exposed surfaces being the surfaces of the portions of the inner lead 3e exposed from the upper surface of the sealing resin 5 in plan view, and the outer leads 3f protrude from the opposing side surfaces of the sealing resin 5 as shown in FIG. 21, so that a sufficient insulating distance can be secured as the distance L2 from the interface between the metal layer 6b of the insulating heat dissipation plate 6 and the cooler (not illustrated) attached to the insulating heat dissipation plate 6 to the first bends 3g.

Embodiment 4

The semiconductor device 202 according to Embodiment 1 described above is applied to a power converter in the present embodiment. The present invention is not limited to a particular power converter, but a case where the present invention is applied to a three-phase inverter will be described below in Embodiment 4.

Figure 24:
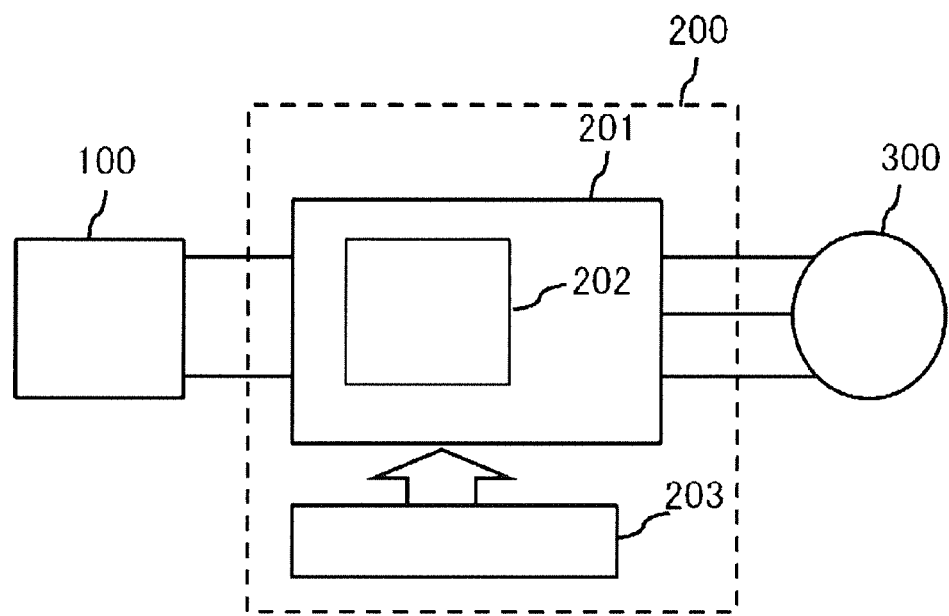
FIG. 24 is a block diagram showing a configuration of a power conversion system including a power converter according to Embodiment 4.

FIG. 24 is a block diagram showing a configuration of a power conversion system to which the power converter according to Embodiment 4 has been applied.

The power conversion system shown in FIG. 24 includes a power supply 100, a power converter 200, and a load 300. The power supply 100 is a DC power supply, and supplies DC power to the power converter 200. The power supply 100 can be configured in various forms, and, for example, can be configured by a DC system, a solar cell, or a storage battery, and may be configured by a rectifier circuit or an AC/DC converter connected to an AC system. The power supply 100 may be configured by a DC/DC converter to convert DC power output from the DC system into predetermined power.

The power converter 200 is a three-phase inverter connected between the power supply 100 and the load 300, and converts the DC power supplied and input from the power supply 100 into AC power, and supplies the AC power to the load 300. As shown in FIG. 24, the power converter 200 includes a main conversion circuit 201 to convert the DC power into the AC power for output and a control circuit 203 to output, to the main conversion circuit 201, a control signal to control the main conversion circuit 201.

The load 300 is a three-phase motor driven by the AC power supplied from the power converter 200. The load 300 is not limited to that for a particular application, is a motor mounted on various types of electrical equipment, and is used as a motor for hybrid vehicles, electric vehicles, railroad vehicles, elevators, and air-conditioning equipment, for example.

The power converter 200 will be described in detail below. The main conversion circuit 201 includes switching elements and freewheeling diodes (not illustrated), and converts the DC power supplied from the power supply 100 into the AC power, and supplies the AC power to the load 300 through switching of the switching elements. The main conversion circuit 201 can have various specific circuit configurations, and the main conversion circuit 201 according to the present embodiment is a two-level three-phase full-bridge circuit, and can include six switching elements and six freewheeling diodes connected in anti-parallel with the respective switching elements. The switching elements and the freewheeling diodes of the main conversion circuit 201 are each configured by the semiconductor device corresponding to that in any of Embodiments 1 to 3 described above. A case where the switching elements and the freewheeling diodes are each configured by the semiconductor device 202 according to Embodiment 1 will be described herein, Every two switching elements out of the six switching elements are connected in series with each other to constitute pairs of upper and lower arms, and the pairs of upper and lower arms constitute respective phases (a U phase, a V phase, and a W phase) of the full-bridge circuit. Output terminals of the respective pairs of upper and lower arms, that is, three output terminals of the main conversion circuit 201 are connected to the load 300.

The main conversion circuit 201 includes a drive circuit (not illustrated) to drive each of the switching elements, and the drive circuit may be incorporated in the semiconductor device 202, or may be provided separately from the semiconductor device 202. The drive circuit generates a drive signal to drive each of the switching elements of the main conversion circuit 201, and supplies the drive signal to a control electrode of each of the switching elements of the main conversion circuit 201. Specifically, the drive circuit outputs, to the control electrode of each of the switching elements, a drive signal to switch the switching element to an on state and a drive signal to switch the switching element to an off state in accordance with the control signal from the control circuit 203, which will be described below. The drive signal is a voltage signal (an on signal) equal to or greater than a threshold voltage of the switching element when the switching element is maintained in the on state, and is a voltage signal (an off signal) equal to or smaller than the threshold voltage of the switching element when the switching element is maintained in the off state.

The control circuit 203 controls the switching elements of the main conversion circuit 201 so that desired power is supplied to the load 300. Specifically, time (on time) during which each of the switching elements of the main conversion circuit 201 is to be in the on state is calculated based on power to be supplied to the load 300. For example, the main conversion circuit 201 can be controlled through PWM control to modulate the on time of each of the switching elements in accordance with a voltage to be output. A control command (the control signal) is output to the drive circuit of the main conversion circuit 201 so that the on signal is output to a switching element to be in the on state, and the off signal is output to a switching element to be in the off state at each time point. The drive circuit outputs, as the drive signal, the on signal or the off signal to the control electrode of each of the switching elements in accordance with the control signal.

In the power converter according to the present embodiment, the semiconductor device 202 according to Embodiment 1 is applied to each of the switching elements and the freewheeling diodes of the main conversion circuit 201 to improve reliability.

An example in which the present invention is applied to the two-level three-phase inverter has been described in the present embodiment, but the present invention is not limited to this example, and is applicable to various power converters. Although the power converter in the present embodiment is a two-level power converter, the power converter may be a three-level or multi-level power converter, and the present invention may be applied to a single-phase inverter when power is supplied to a single-phase load. The present invention is applicable to a DC/DC converter or an AC/DC converter when power is supplied to a DC load and the like.

The power converter to which the present disclosure has been applied is not limited to that in the above-mentioned case where the load is the motor, and can be used as a power supply device of an electrical discharge machine, a laser machine, an induction cooker, and a noncontact power supply system, for example, and can further be used as a power conditioner of a photovoltaic system, a storage system, and the like.

Embodiments of the present disclosure can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor element;
   an inner lead having a die pad having an upper surface to which the semiconductor element is mounted;
   a sealing resin sealing the semiconductor element and the inner lead; and
   an outer lead electrically connected to the semiconductor element and the inner lead, and protruding from opposing side surfaces of the sealing resin, wherein
   the inner lead has a stepped profile, and a surface of a portion of the inner lead is exposed from an upper surface of the sealing resin in plan view, and
   the outer lead has a first bend at each of the side surfaces of the sealing resin to extend in a direction on a side of the upper surface of the die pad, wherein
   the inner leads and the outer leads are integrally connected to one another.

2. The semiconductor device according to claim 1, wherein
   the outer lead has, at the first bend, a groove in a surface to be subjected to compressive stress by being bent.

3. The semiconductor device according to claim 1, further comprising
   an insulating heat dissipation plate located on a lower surface of the die pad to which the semiconductor element is mounted, and exposed from the sealing resin.

4. The semiconductor device according to claim 3, further comprising
   a plate-like thermally conductive material located on a surface of the insulating heat dissipation plate exposed from the sealing resin.

5. The semiconductor device according to claim 1, wherein
   the semiconductor element is an RC-IGBT.

6. The semiconductor device according to claim 1, wherein
   the semiconductor element comprises a wide bandgap semiconductor.

7. A power converter comprising:
   a main conversion circuit to convert input power for output, the main conversion circuit including the semiconductor device according to claim 1; and
   a control circuit to output, to the main conversion circuit, a control signal to control the main conversion circuit.

8. A semiconductor device comprising:
   a semiconductor element;
   an inner lead having a die pad having an upper surface to which the semiconductor element is mounted;
   a sealing resin sealing the semiconductor element and the inner lead; and
   an outer lead electrically connected to the semiconductor element and the inner lead, and protruding from opposing side surfaces of the sealing resin, wherein
   the inner lead has a stepped profile and an exposed surface that is a surface of a portion of the inner lead and exposed from an upper surface of the sealing resin in plan view, and
   the outer lead has a first bend at each of the side surfaces of the sealing resin, and is disposed parallel to the exposed surface of the inner lead exposed from the sealing resin, wherein
   the inner leads and the outer leads are integrally connected to one another.

9. The semiconductor device according to claim 8, wherein
   the outer lead has a second bend to extend in a direction on a side of the upper surface of the die pad.

10. The semiconductor device according to claim 8, wherein
    the outer lead has, at the first bend, a groove in a surface to be subjected to compressive stress by being bent.

11. The semiconductor device according to claim 8, further comprising
    an insulating heat dissipation plate located on a lower surface of the die pad to which the semiconductor element is mounted, and exposed from the sealing resin.

12. The semiconductor device according to claim 11, further comprising
    a plate-like thermally conductive material located on a surface of the insulating heat dissipation plate exposed from the sealing resin.

13. The semiconductor device according to claim 8, wherein
    the semiconductor element is an RC-IGBT.

14. The semiconductor device according to claim 8, wherein
    the semiconductor element comprises a wide bandgap semiconductor.

15. A power converter comprising:
   a main conversion circuit to convert input power for output, the main conversion circuit including the semiconductor device according to claim 8; and
   a control circuit to output, to the main conversion circuit, a control signal to control the main conversion circuit.

16. A semiconductor device manufacturing method comprising:
   a member preparation step of preparing a lead frame including an inner lead having a die pad, a tie bar, a framework, and an outer lead, the lead frame having a stepped profile;
   a die bonding step of mounting a semiconductor element to the die pad;
   a wiring step of wiring the semiconductor element and the inner lead using a metal wire;
   a sealing step of sealing the semiconductor element, the metal wire, and the inner lead with a sealing resin so that the inner lead has an exposed surface that is a surface of a portion of the inner lead and exposed an upper surface of the sealing resin in plan view;
   a tie bar cutting step of cutting and removing the tie bar;
   a plating step of plating the outer lead, the exposed surface of the inner lead exposed from the sealing resin, and the framework;
   a frame cutting step of cutting and removing the framework; and
   a lead forming step of bending the outer lead at opposing side surfaces of the sealing resin, wherein
   the inner leads and the outer leads are integrally connected to one another.

17. The semiconductor device manufacturing method according to claim 16, wherein
   the lead forming step includes bending a plurality of portions of the outer lead.

18. The semiconductor device manufacturing method according to claim 16, wherein
   the member preparation step includes preparing the lead frame including the outer lead having a groove.

* * * * *